(12) United States Patent
Park et al.

(10) Patent No.: US 11,785,318 B2
(45) Date of Patent: *Oct. 10, 2023

(54) CAMERA MODULE INCLUDING A HOUSING WITH AN ADHESION SURFACE

(71) Applicant: LG INNOTEK CO., LTD., Seoul (KR)

(72) Inventors: Ji Hwan Park, Seoul (KR); Myoung Jin An, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/456,285

(22) Filed: Nov. 23, 2021

(65) Prior Publication Data

US 2022/0103724 A1    Mar. 31, 2022

Related U.S. Application Data

(63) Continuation of application No. 16/781,414, filed on Feb. 4, 2020, now Pat. No. 11,218,623, which is a
(Continued)

(30) Foreign Application Priority Data

Oct. 21, 2015    (KR) .......................... 10-2015-0146617

(51) Int. Cl.
*H04N 23/54*     (2023.01)
*H04N 23/51*     (2023.01)
(Continued)

(52) U.S. Cl.
CPC ............. *H04N 23/54* (2023.01); *H04N 23/51* (2023.01); *B60R 1/00* (2013.01); *H05K 1/144* (2013.01);
(Continued)

(58) Field of Classification Search
CPC .. H04N 5/2253; H04N 5/2252; H04N 5/2251; H04N 5/2254; H04N 5/2257;
(Continued)

(56) References Cited

U.S. PATENT DOCUMENTS 7,556,504 B2    7/2009  Ryu
7,665,915 B2    2/2010  Lee
(Continued)

FOREIGN PATENT DOCUMENTS

CN          1845333 A      10/2006
CN        101064776 A      10/2007
(Continued)

OTHER PUBLICATIONS

Notice of Allowance dated Apr. 29, 2022 in Chinese Application No. 202011279693.4.
(Continued)

*Primary Examiner* — Padma Haliyur
(74) *Attorney, Agent, or Firm* — Saliwanchik, Lloyd & Eisenschenk

(57) ABSTRACT

One embodiment relates to a camera module comprising: a housing; a first printed circuit board having an image sensor mounted thereon, and loaded in the housing such that the image sensor is accommodated in the housing; a second printed circuit board and a third printed circuit board sequentially arranged on the lower part of the first printed circuit board in the vertical direction; a support unit arranged in the housing while accommodating the first printed circuit board therein, and having a stepped portion including a first loading portion at which the second printed circuit board is placed and a second loading portion at which the third printed circuit board is placed; and a fixing unit coupled to the housing by penetrating through a first groove portion and a second groove portion, which are respectively formed at
(Continued)

the edge parts of the second printed circuit board and the third printed circuit board, and through a third groove portion formed at the edge part of the support unit.

20 Claims, 7 Drawing Sheets

Related U.S. Application Data continuation of application No. 15/770,436, filed as application No. PCT/KR2016/011871 on Oct. 21, 2016, now Pat. No. 10,594,907.

(51) Int. Cl.
  *B60R 1/00* (2022.01)
  *H05K 1/14* (2006.01)
  *H05K 1/18* (2006.01)
  *H05K 5/00* (2006.01)

(52) U.S. Cl.
  CPC .......... *H05K 1/181* (2013.01); *H05K 5/006* (2013.01); *H05K 5/0052* (2013.01); *H05K 2201/10121* (2013.01); *H05K 2201/10151* (2013.01)

(58) Field of Classification Search
  CPC .......... B60R 1/00; H05K 1/144; H05K 1/181; H05K 5/0052; H05K 5/006; H05K 2201/10121; H05K 2201/10151; H05K 1/189
  See application file for complete search history.

(56) References Cited

U.S. PATENT DOCUMENTS

| 9,088,705 | B1 | 7/2015 | Tam |
| 10,594,907 | B2 | 3/2020 | Park et al. |
| 2006/0227236 | A1 | 10/2006 | Pak |
| 2011/0242321 | A1 | 10/2011 | Nakajima et al. |
| 2012/0044411 | A1 | 2/2012 | Wang et al. |
| 2014/0320657 | A1 | 10/2014 | Han et al. |
| 2015/0205186 | A1 | 7/2015 | Park et al. |

FOREIGN PATENT DOCUMENTS

| CN | 101295848 A | 10/2008 |
| CN | 101790038 A | 7/2010 |
| CN | 201717956 U | 1/2011 |
| CN | 102566000 A | 7/2012 |
| CN | 103222257 A | 7/2013 |
| CN | 103930309 A | 7/2014 |
| JP | 2003-046815 A | 2/2003 |
| JP | 2008-076628 A | 4/2008 |
| JP | 2010-177822 A | 8/2010 |
| JP | 2011-259101 A | 12/2011 |
| JP | 2012-118517 A | 6/2012 |
| KR | 10-0920781 B1 | 10/2009 |
| KR | 10-2010-0113732 A | 10/2010 |
| KR | 10-2013-0050767 A | 5/2013 |

OTHER PUBLICATIONS

International Search Report in International Application No. PCT/KR2016/011871.
Office Action dated Jul. 16, 2019 in U.S. Appl. No. 15/770,436.
Notice of Allowance dated Nov. 4, 2019 in U.S. Appl. No. 15/770,436.
Office Action dated Mar. 12, 2020 in Chinese Application No. 201680061978.6.
Office Action dated Sep. 1, 2021 in Korean Application No. 10-2015-0146617.
Office Action dated Sep. 26, 2021 in Chinese Application No. 202011279693.4.
Office Action dated Mar. 8, 2021 in U.S. Appl. No. 16/781,414.
Notice of Allowance dated Aug. 25, 2021 in U.S. Appl. No. 16/781,414.

CAMERA MODULE INCLUDING A HOUSING WITH AN ADHESION SURFACE

CROSS-REFERENCE TO RELATED APPLICATIONS

This application is a continuation of U.S. application Ser. No. 16/781,414, filed Feb. 4, 2020; which is a continuation of U.S. application Ser. No. 15/770,436, filed Apr. 23, 2018, now U.S. Pat. No. 10,594,907, issued Mar. 17, 2020; which is the U.S. national stage application of International Patent Application No. PCT/KR2016/011871, filed Oct. 21, 2016, which claims priority to Korean Application No. 10-2015-0146617, filed Oct. 21, 2015, the disclosures of each of which are incorporated herein by reference in their entirety.

TECHNICAL FIELD

Embodiments relate to a camera module.

BACKGROUND ART

In recent vehicle technology, a system making it possible to check the left and right sides and the front and rear of a vehicle through a display disposed in a dashboard of the vehicle using images captured by small-sized cameras installed at the front and rear parts of the vehicle as well as the left and right parts of the vehicle for safe driving has been used, or small-sized cameras have been utilized at various places for various purposes in order to check images of the surroundings in real time. In the full-scale utilization of cameras, the quality of images captured by the cameras is very important in evaluating the performance of the cameras. Cameras that have been used in recent years have circuit-related problems, such as data compression, power consumption, and limited internal memory, and camera module-related problems, such as difficulty in optical zooming, the use of low-pass optical filters, low-quality reproduction of colors, and limited resolution. As a result, the quality of images captured by such cameras is lower than the quality of images captured by dedicated digital cameras.

The overall quality of an image is determined based on an image chain comprising an input module, an image processing module, and an output module. In particular, the quality of the image is greatly affected by the characteristics of the input module, such as a camera.

A conventional camera module includes a printed circuit board, an image sensor mounted on the printed circuit board, a housing for receiving the image sensor mounted on the printed circuit board, and a lens barrel coupled to the housing so as to be located above the image sensor. The image sensor and a lens mounted in the lens barrel are aligned with each other based on the optical axis of the lens. Subsequently, the housing and the lens barrel are assembled and fixed to each other using an adhesive. In addition, the housing and the printed circuit board are assembled and fixed to each other using an adhesive. A plurality of printed circuit boards, including a printed circuit board for supplying power to the printed circuit board having the image sensor mounted thereon, may be further disposed on the printed circuit board having the image sensor mounted thereon.

In the case in which the plurality of printed circuit boards is connected to the printed circuit board having the image sensor mounted thereon, however, the printed circuit board having the image sensor mounted thereon may be physically stressed by the plurality of printed circuit boards disposed on the printed circuit board having the image sensor mounted thereon.

DISCLOSURE

Technical Problem

Embodiments provide a camera module configured such that a plurality of printed circuit boards is arranged in a housing so as to be spaced apart from each other by a predetermined distance.

Technical Solution

In one embodiment, a camera module includes a housing, a first printed circuit board having an image sensor mounted thereon, the first printed circuit board being located in the housing such that the image sensor is received in the housing, a second printed circuit board and a third printed circuit board sequentially disposed under the first printed circuit board in a vertical direction, a support unit disposed in the housing while receiving the first printed circuit board, the support unit being provided with a stair portion including a first location portion, on which the second printed circuit board is located, and a second location portion, on which the third printed circuit board is located, and a fixing unit coupled to the housing through a first recess and a second recess formed in corners of the second printed circuit board and the third printed circuit board, respectively, and through a third recess formed in a corner of the support unit.

An adhesion surface may be disposed in the housing in a protruding state so as to contact an edge of the first printed circuit board.

A concave and convex portion may be formed on the adhesion surface.

A plurality of first coupling protrusions may be disposed on one surface of the support unit that contacts the housing, and first coupling recesses may be disposed in the housing so as to correspond to the first coupling protrusions such that the first coupling protrusions are inserted into the first coupling recesses.

A plurality of second coupling protrusions may be disposed on the other surface of the support unit that contacts the second printed circuit board, and coupling holes may be disposed in the second printed circuit board so as to correspond to the second coupling protrusions such that the second coupling protrusions are inserted into the coupling holes.

The fixing unit may include a first fixing unit, extending through the first recess of the second printed circuit board and the third recess of the support unit, and a second fixing unit, extending through the second recess of the third printed circuit board and the third recess of the support unit.

A second coupling recess may be disposed in the housing so as to correspond to the third recess.

A first protruding portion, which contacts the first recess of the second printed circuit board, may be disposed on one end of the first fixing unit, and a first screw thread, which is screw-engaged into the second coupling recess of the housing, may be disposed on the other end of the first fixing unit.

A second protruding portion, which contacts the second recess of the third printed circuit board, may be disposed on one end of the second fixing unit, and a second screw thread, which is screw-engaged into the second coupling recess of the housing, may be disposed on the other end of the second fixing unit.

A fitting recess may be disposed in an edge of the third printed circuit board that contacts the support unit.

A fitting protrusion configured to be coupled into the fitting recess may be disposed in the support unit.

In another embodiment, a camera module includes a housing, a first printed circuit board having an image sensor mounted thereon, the first printed circuit board being located in the housing such that the image sensor is received in the housing, a second printed circuit board and a third printed circuit board sequentially disposed under the first printed circuit board in a vertical direction, a support unit disposed in the housing while receiving the first printed circuit board, the support unit being provided with a stair portion including a first location portion, on which the second printed circuit board is located, and a second location portion, on which the third printed circuit board is located, and a fixing unit coupled to the housing through a first recess and a second recess formed in corners of the second printed circuit board and the third printed circuit board, respectively, and through a third recess formed in a corner of the support unit, wherein the sectional area of the first printed circuit board is configured so as to be smaller than the sectional area of the second printed circuit board and the sectional area of the third printed circuit board.

A plurality of first coupling protrusions may be disposed on one surface of the support unit that contacts the housing, and first coupling recesses may be disposed in the housing so as to correspond to the first coupling protrusions such that the first coupling protrusions are inserted into the first coupling recesses.

A plurality of second coupling protrusions may be disposed on the other surface of the support unit that contacts the second printed circuit board, and coupling holes may be disposed in the second printed circuit board so as to correspond to the second coupling protrusions such that the second coupling protrusions are inserted into the coupling holes.

The fixing unit may include a first fixing unit, extending through the first recess of the second printed circuit board and the third recess of the support unit, and a second fixing unit, extending through the second recess of the third printed circuit board and the third recess of the support unit.

A second coupling recess may be disposed in the housing so as to correspond to the third recess.

A first protruding portion, which contacts the first recess of the second printed circuit board, may be disposed on one end of the first fixing unit, and a first screw thread, which is screw-engaged into the second coupling recess of the housing, may be disposed on the other end of the first fixing unit.

A second protruding portion, which contacts the second recess of the third printed circuit board, may be disposed on one end of the second fixing unit, and a second screw thread, which is screw-engaged into the second coupling recess of the housing, may be disposed on the other end of the second fixing unit.

In a further embodiment, a camera module includes a housing, a first printed circuit board having an image sensor mounted thereon, the first printed circuit board being located in the housing such that the image sensor is received in the housing, a second printed circuit board and a third printed circuit board sequentially disposed under the first printed circuit board in a vertical direction, a support unit disposed in the housing while receiving the first printed circuit board, the support unit being provided with a stair portion including a first location portion, on which the second printed circuit board is located, and a second location portion, on which the third printed circuit board is located, and a fixing unit coupled to the housing through a first recess and a second recess formed in corners of the second printed circuit board and the third printed circuit board, respectively, and through a third recess formed in a corner of the support unit, wherein an adhesion surface is disposed in the housing in a protruding state so as to contact an edge of the first printed circuit board.

A concave and convex portion may be formed on the adhesion surface.

Advantageous Effects

In the embodiments described above, a plurality of printed circuit boards is disposed in a housing so as to be e spaced apart from each other. As a result, the printed circuit boards are not physically stressed, whereby a printed circuit board having an image sensor mounted thereon is not deformed or dislocated. Consequently, it is possible to acquire a captured image without distortion.

BEST MODE

Figure 1:
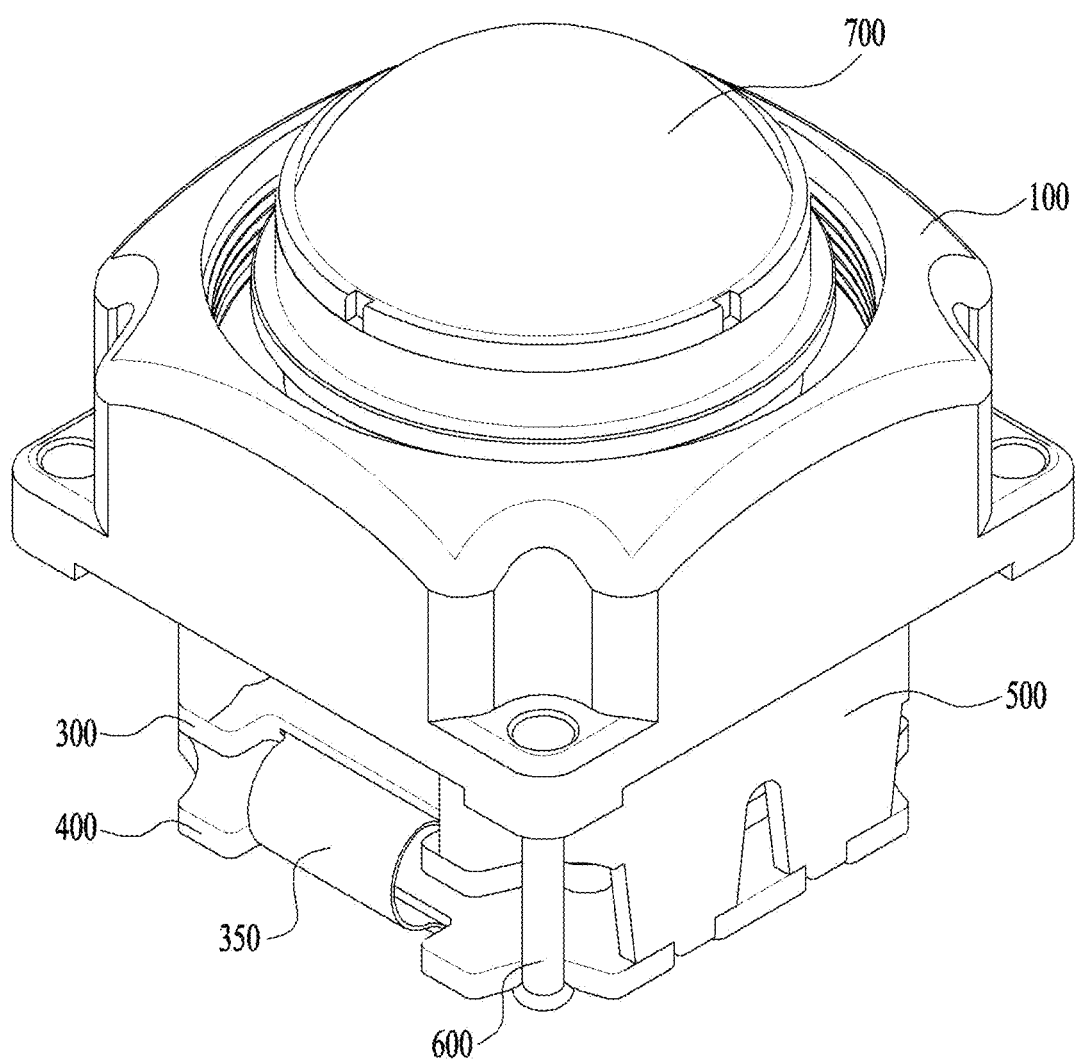
FIG. 1 is a perspective view showing a camera module according to an embodiment.

Reference will now be made in detail to embodiments, examples of which are illustrated in the accompanying drawings.

In the following description of the embodiments, it will be understood that, when each element is referred to as being "on" or "under" another element, it can be "directly" on or under another element, or can be "indirectly" disposed in relation thereto such that an intervening element is present therebetween. In addition, when an element is referred to as being "on" or 'under," "under the element" as well as "on the element" can be included based on the element.

In the drawings, the thicknesses or sizes of respective layers may be exaggerated, omitted, or schematically shown for convenience and clarity of description. Further, the sizes of the respective elements may not denote the actual sizes thereof.

Figure 2:
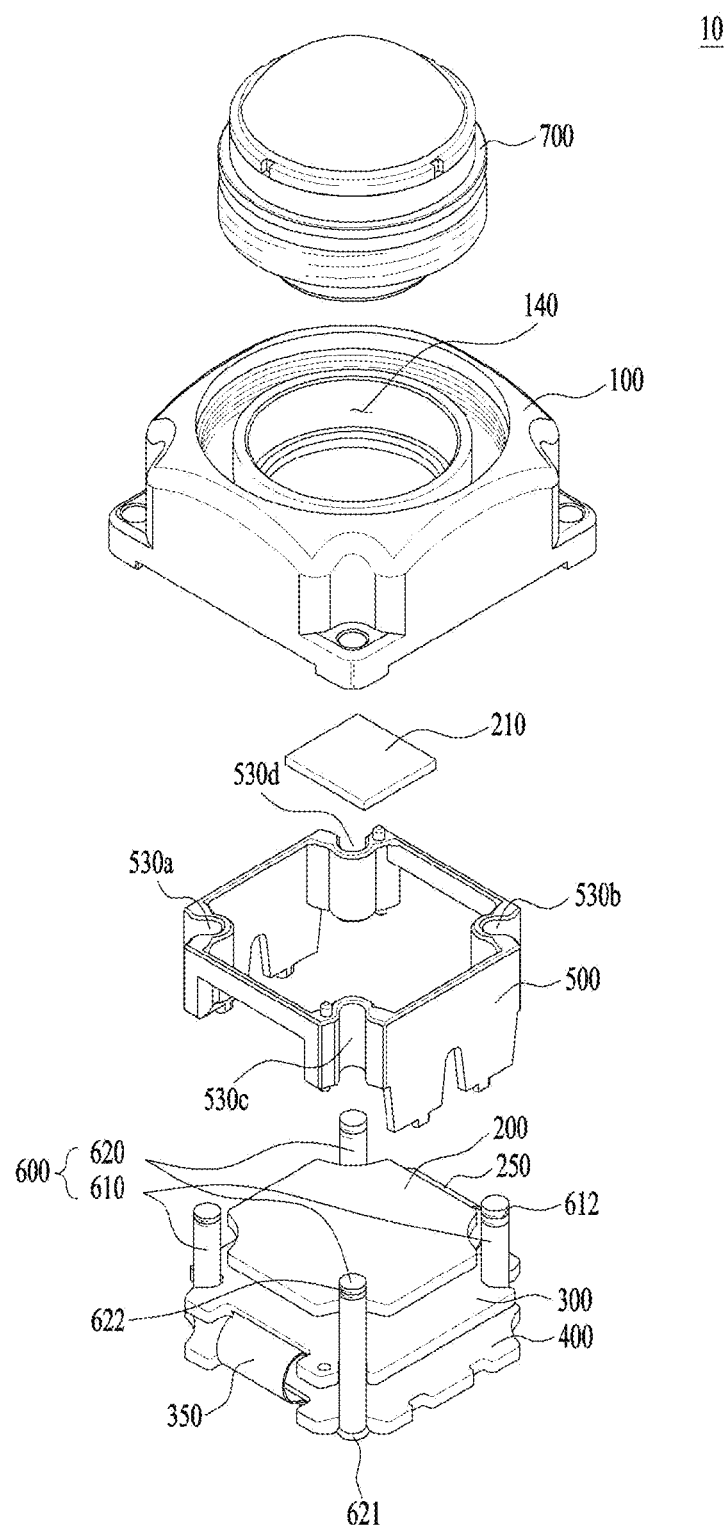
FIG. 2 is an exploded perspective view showing the camera module according to the embodiment.

FIG. 1 is a perspective view showing a camera module according to an embodiment, and FIG. 2 is an exploded perspective view showing the camera module according to the embodiment.

Referring to FIGS. 1 and 2, a camera module 10 according to this embodiment includes a housing 100, a first printed circuit board 200 having an image sensor mounted thereon, a second printed circuit board 300 and a third printed circuit board 400 disposed under the first printed circuit board 200, a support unit 500 in which the second printed circuit board 300 and the third printed circuit board 400 are located, and a fixing unit 600 for fixing the second printed circuit board 300 and the third printed circuit board 400 located in the support unit 500.

The housing 100 is provided with a through hole 140, which is formed in the vertical direction. A lens barrel 700 is coupled into the upper part of the through hole 140. Consequently, the inner diameter of the through hole 140 may be formed so as to correspond to the outer diameter of the lens barrel 700.

At least one lens may be disposed in the lens barrel 700. Alternatively, a plurality of lenses may be arranged in the lens barrel in the state of being stacked so as to be spaced apart from each other by a predetermined distance.

Meanwhile, a cover glass for protecting the lens may be further disposed at the upper end of the lens barrel 700.

In addition, the first printed circuit board 200 may be disposed in the housing 100, and an image sensor 210 may be mounted on the first printed circuit board 200. The first printed circuit board 200 may be located in the housing 100 such that the image sensor 210 is received in the through hole 140 of the housing 100 while facing the lens barrel 700.

The image sensor 210, which condenses incident light in order to generate an image signal, may be a complementary metal-oxide semiconductor (CMOS) sensor or a charge-coupled device (CCD) sensor.

Meanwhile, the support unit 500, a description of which will follow, may be disposed in the housing 100 so as to receive the first printed circuit board 200. The second printed circuit board 300 and the third printed circuit board 400 may be located in the support unit 500 so as to be disposed under the first printed circuit board 200 in the state of being successively spaced apart from each other in the vertical direction.

Conventionally, when a plurality of printed circuit boards is disposed under a first printed circuit board having an image sensor mounted thereon, the plurality of printed circuit boards is disposed so as to be connected to the first printed circuit board in the vertical direction. In this structure, the weight of the plurality of printed circuit boards connected to the first printed circuit board is applied to the first printed circuit board. Due to such physical stress, the first printed circuit board is deformed or tilted, whereby the first printed circuit board is dislocated. As a result, an image acquired by the camera module is distorted.

In this embodiment, the sectional area of the first printed circuit board 200 may be configured so as to be smaller than the sectional area of the second printed circuit board 300 and the sectional area of the third printed circuit board 400 such that the first printed circuit board 200 is located in the housing 100. In addition, the support unit 500, in which the second printed circuit board 300 and the third printed circuit board 400 are located, may be disposed so as to receive the first printed circuit board 200. As a result, the second printed circuit board 300 and the third printed circuit board 400 may be disposed under the first printed circuit board 200 without direct connection with the first printed circuit board 200.

Figure 3:
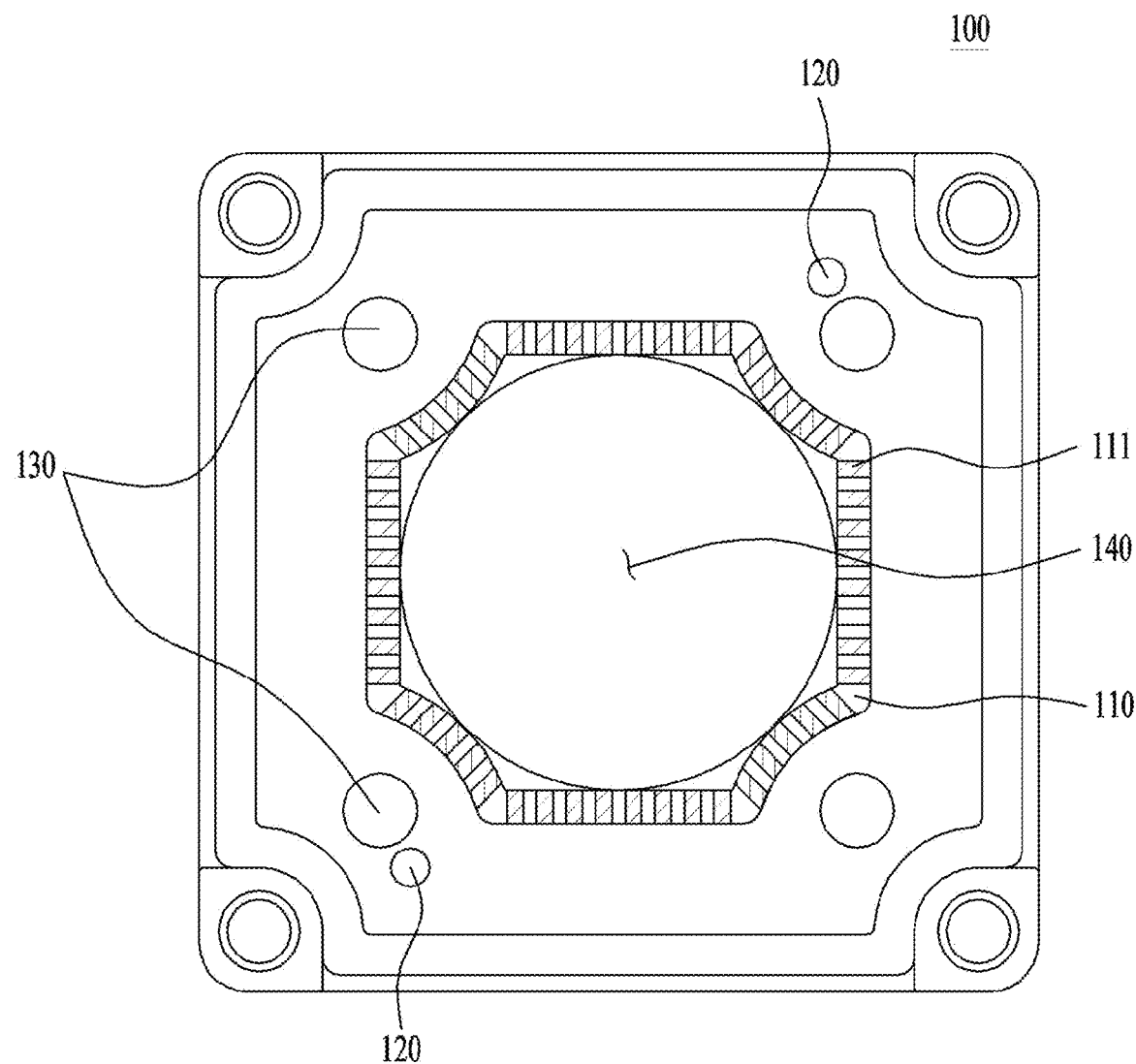
FIG. 3 is a plan view showing a housing of the camera module according to the embodiment.
Figure 4:
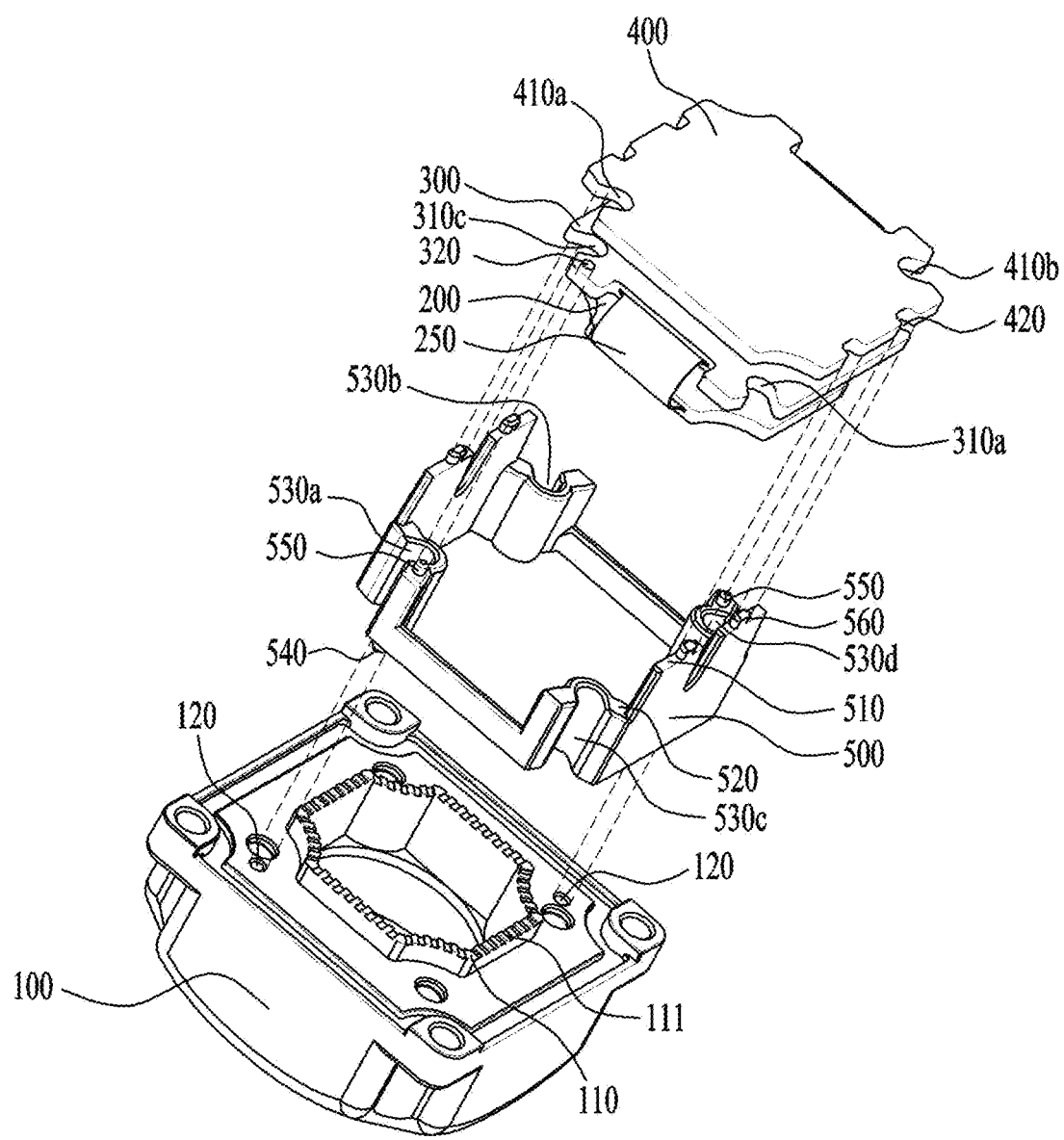
FIG. 4 is an exploded perspective view showing the coupling relationship between the housing, a support unit, and printed circuit boards of the camera module according to the embodiment.
Figure 5:
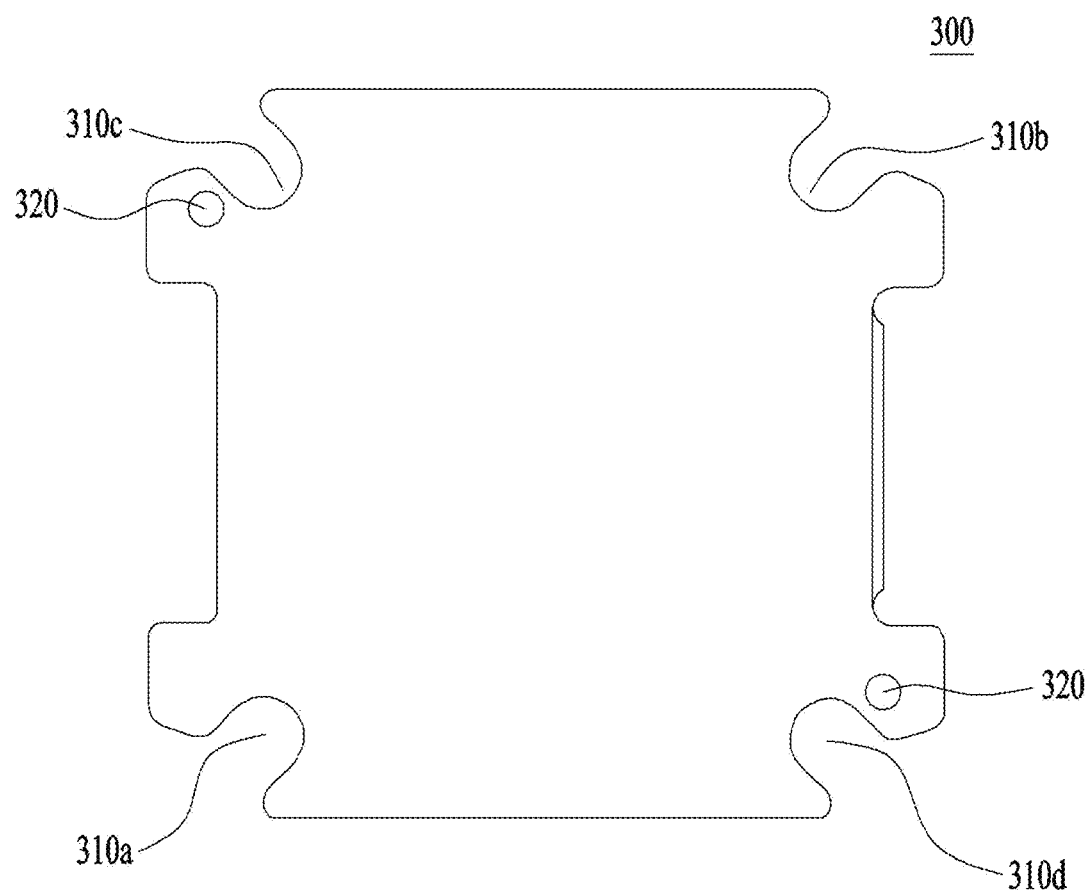
FIG. 5 is a plan view showing a second printed circuit board of the camera module according to the embodiment.
Figure 6:
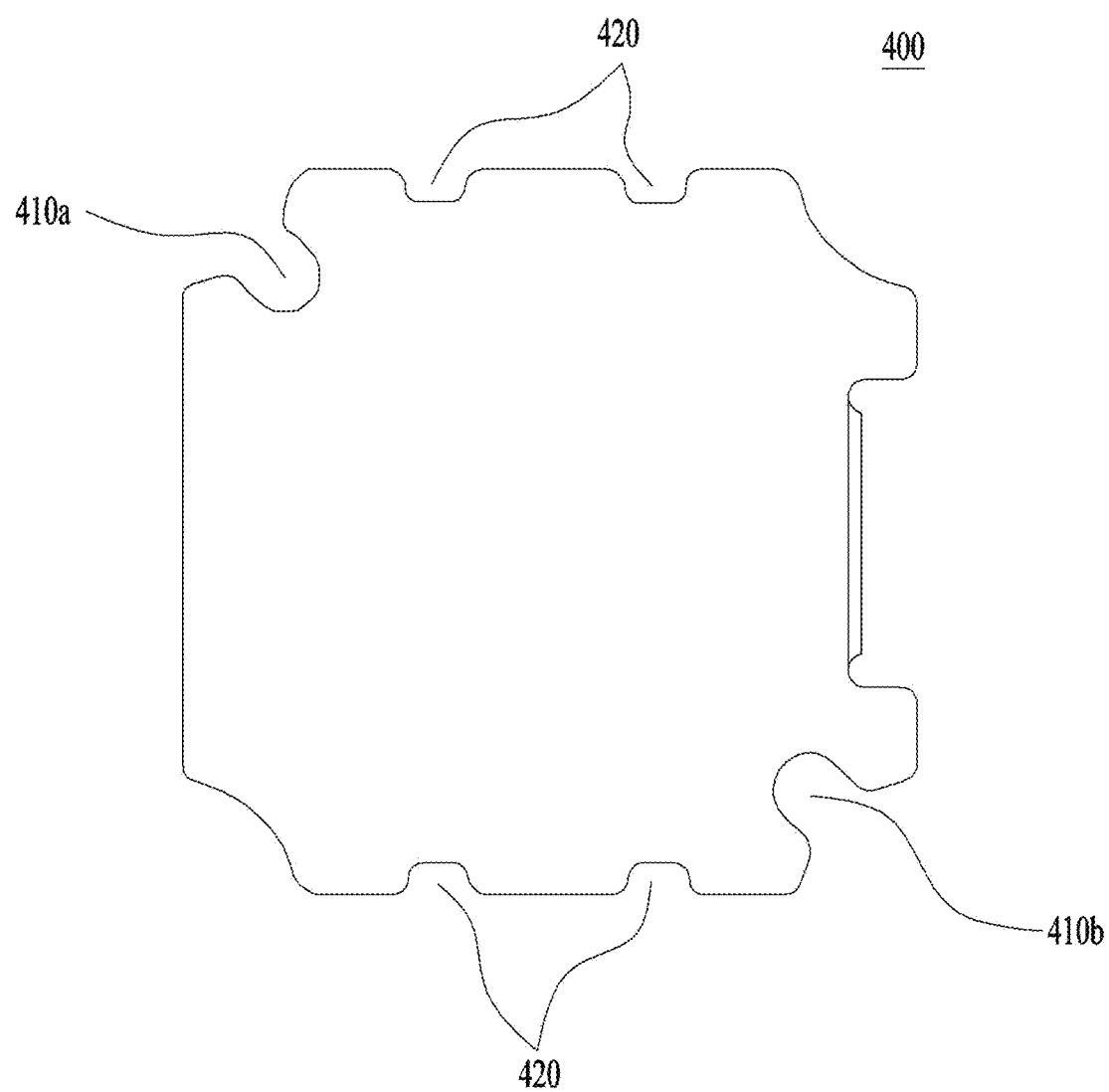
FIG. 6 is a plan view showing a third printed circuit board of the camera module according to the embodiment.
Figure 7:
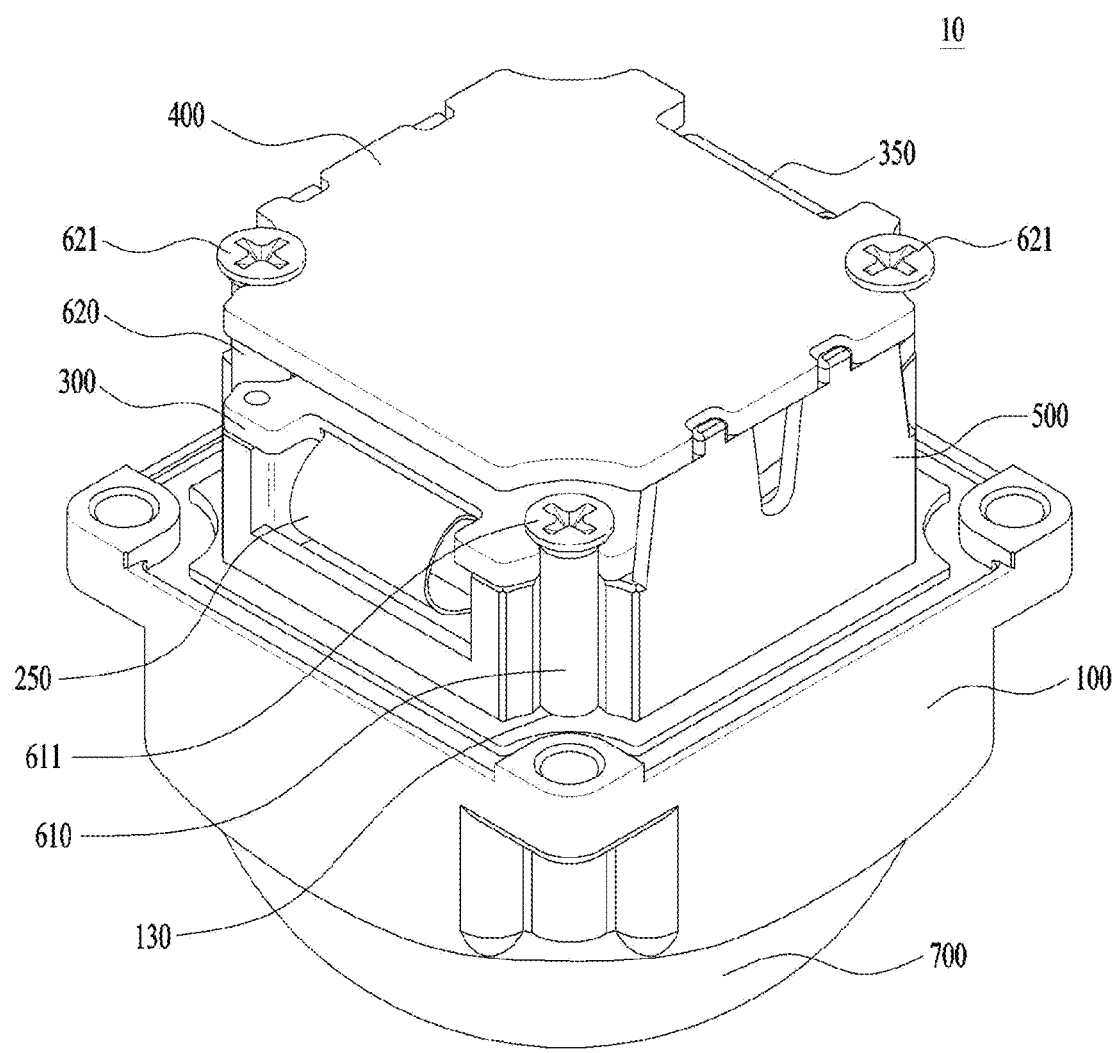
FIG. 7 is a perspective view showing the bottom surface of the camera module according to the embodiment.

FIG. 3 is a plan view showing the housing of the camera module according to the embodiment, FIG. 4 is an exploded perspective view showing the coupling relationship between the housing, the support unit, and the printed circuit boards of the camera module according to the embodiment, FIG. 5 is a plan view showing the second printed circuit board of the camera module according to the embodiment, FIG. 6 is a plan view showing the third printed circuit board of the camera module according to the embodiment, and FIG. 7 is a perspective view showing the bottom surface of the camera module according to the embodiment.

Referring to FIGS. 3 and 4, an adhesion surface 110 may be disposed in the housing 100 so as to contact the edge of the first printed circuit board 200.

In addition, an adhesion member (not shown) may be disposed between the adhesion surface 110 and the first printed circuit board 200. The adhesion member (not shown) may be a liquid-phase adhesive, to which ultraviolet rays are irradiated so as to solidify the adhesive within a short time through the reaction of an optical initiator contained in the adhesive, i.e. a UV hardening adhesive. However, the disclosure is not limited thereto.

Besides, the adhesion surface 110 may protrude to a predetermined height such that the adhesion member (not shown) is disposed only between the adhesion surface 110 and the edge of the first printed circuit board 200, whereby the adhesion member is inhibited from spreading out to the lower end surface of the housing, excluding the adhesion surface 110.

If the width of the adhesion surface 110 is too small, the adhesion force between the adhesion surface and the first printed circuit board 200 may be reduced. If the width of the adhesion surface 110 is too large, the adhesion surface 110 may contact a circuit of the first printed circuit board 200. Consequently, the width of the adhesion surface 110 may be set in consideration of the size and structure of the first printed circuit board 200.

In addition, a concave and convex portion 111 for increasing the adhesion force of the adhesion member (not shown) may be formed on the adhesion surface.

Referring to FIGS. 4 to 7, the support unit 500 may be disposed in the housing 100 so as to receive the first printed circuit board 200. In addition, the support unit 500 may be provided with a stair portion including a first location portion 510, on which the second printed circuit board 300 is located, and a second location portion 520, on which the third printed circuit board 400 is located, such that the second printed circuit board 300 and the third printed circuit board 400 are spaced apart from each other in the vertical direction.

The edge of the second printed circuit board 300 may be located on the first location portion 510, and the edge of the third printed circuit board 400 may be located on the second location portion 520.

A plurality of first coupling protrusions 540 may be disposed on one surface of the support unit 500 that contacts the housing 100.

In addition, first coupling recesses 120 may be disposed in the housing 100 so as to correspond to the first coupling protrusions 540. The first coupling protrusions 540 may be inserted into the first coupling recesses 120 such that the support unit 500 is fixed to the housing 100.

Besides, the distal end of each of the first coupling protrusions 540 may be inclined or curved such that the first coupling protrusions 540 can be easily inserted into the first coupling recesses 120.

In this embodiment, a first coupling protrusion 540 is disposed at each of diagonally facing corners of one surface of the support unit 500, and the first coupling recesses 120 are disposed in the housing 100 so as to correspond to the first coupling protrusions 540. However, the number or shape of the first coupling protrusions and the first coupling recesses is not limited thereto, as long as the first coupling protrusions and the first coupling recesses can fix the support unit 500 to the housing 100.

As described above, after the support unit 500 is coupled and fixed to the housing 100, the second printed circuit board 300 may be disposed so as to be spaced apart from the first printed circuit board 200, and the second printed circuit board 300 may be disposed so as to be spaced apart from the third printed circuit board 400.

In addition, a plurality of second coupling protrusions 550 may be disposed on the other surface of the support unit 500 that contacts the second printed circuit board 300, and coupling holes 320 may be disposed in the second printed circuit board 300 so as to correspond to the second coupling protrusions 550.

The height of each of the second coupling protrusions 550 may be set so as to be equal to the thickness of the second printed circuit board 300.

In this embodiment, a second coupling protrusion 550 is disposed at each of diagonally facing corners of the other surface of the support unit 500, and the coupling holes 320 may be disposed in the second printed circuit board 300 so as to correspond to the second coupling protrusions 550. When the second printed circuit board 300 is located in the support unit 500, therefore, the second coupling protrusions 550 are inserted into the coupling holes 320, whereby the second printed circuit board 300 may be fixed to the support unit 500. However, the structure by which the second printed circuit board 300 is fixed to the support unit 500 is not limited thereto.

A first recess 310a, 310b, 310c, and 310d may be formed in outer corners of the second printed circuit board 300 in the thickness direction of the second printed circuit board 300, and a second recess 410a and 410b may be formed in outer corners of the third printed circuit board 400 in the thickness direction of the third printed circuit board 400. In addition, a third recess 530a, 530b, 530c, and 530d may be formed in outer corners of the support unit 500 in the height direction of the support unit 500.

Referring to FIGS. 2 to 7, the fixing unit 600 may be formed in the shape of a cylindrical bar, and may be coupled to the housing 100 through the first recess 310a, 310b, 310c, and 310d, the second recess 410a and 410b, and the third recess 530a, 530b, 530c, and 530d.

More specifically, the fixing unit 600 may include a first fixing unit 610, extending through the first recess 310a and 310b of the second printed circuit board 300 and the third recess 530a and 530b of the support unit 500, and a second fixing unit 620, extending through the second recess 410a and 410b of the third printed circuit board 400 and the third recess 530c and 530d of the support unit 500.

Second coupling recesses 130 may be disposed in the housing 100 so as to correspond to the third recess 530a, 530b, 530c, and 530d such that the first fixing unit 610 and the second fixing unit 620 are coupled and fixed into the second coupling recesses 130.

In addition, the first recess 310a and 310b may include a 1-1 recess 310a and a 1-2 recess 310b, the second recess 410a and 410b may include a 2-1 recess 410a and a 2-2 recess 410b, and the third recess 530a, 530b, 530c, 530d may include a 3-1 recess 530a, a 3-2 recess 530b, a 3-3 recess 530c, and a 3-4 recess 530d.

The 1-1 recess 310a and the 1-2 recess 310b of the second printed circuit board 300 may be disposed so as to be connected respectively to the 3-1 recess 530a and the 3-2 recess 530b of the support unit 500, and the first fixing unit 610 may extend through the 3-1 recess 530a and the 1-1 recess 310a and through the 3-2 recess 530b and the 1-2 recess 310b.

In addition, a first protruding portion 611, which contacts a corresponding one of the 1-1 recess 310a and the 1-2 recess 310b of the second printed circuit board 300, may be disposed on one end of the first fixing unit 610, and a first screw thread 612, which is screw-engaged into a corresponding one of the second coupling recesses 130 of the housing 100, may be disposed on the other end of the first fixing unit 610.

The first fixing unit 610 is coupled into each of the second coupling recesses 130 through the first screw thread 612, and at the same time, the first protruding portions 611 are disposed on the second printed circuit board 300, whereby the first fixing unit 610 may fix the second printed circuit board 300 to the first location portion 510 of the support unit 500.

Meanwhile, fitting recesses 420 may be disposed in the edge of the third printed circuit board 400 that contacts the support unit 500. In addition, fitting protrusions 560 corresponding to the fitting recesses 420 may be disposed in the support unit 500. The height of each of the fitting protrusions 560 may be set so as to be equal to the thickness of the third printed circuit board 400.

The fitting protrusions 560 may be coupled into the fitting recesses 420 such that the third printed circuit board 400 is fixed to the support unit 500.

In this embodiment, a pair of fitting recesses 420 is formed in each of opposite edge portions of the third printed circuit board 400 such that fitting protrusions 560 of the support unit 500 can be inserted into the fitting recesses 420. However, the structure by which the third printed circuit board 400 is disposed and fixed to the support unit 500 is not limited thereto.

In addition, the 2-1 recess 410a and the 2-2 recess 410b of the third printed circuit board 400 may be disposed so as to be connected respectively to the 3-3 recess 530c and the 3-4 recess 530d of the support unit 500, and the second fixing unit 620 may extend through the 3-3 recess 530c and the 2-1 recess 410a and through the 3-4 recess 530d and the 2-2 recess 410b.

In addition, a second protruding portion 621, which contacts a corresponding one of the 2-1 recess 410a and the 2-2 recess 410b of the third printed circuit board 400, may be disposed on one end of the second fixing unit 620, and a second screw thread 622, which is screw-engaged into a corresponding one of the second coupling recesses 130 of the housing 100, may be disposed on the other end of the second fixing unit 620.

The second fixing unit 620 is coupled into each of the second coupling recesses 130 through the second screw thread 622, and at the same time the second protruding portions 621 are disposed on the third printed circuit board 400, whereby the second fixing unit 620 may fix the third printed circuit board 400 to the second location portion 520 of the support unit 500.

Meanwhile, one side of the edge of the first printed circuit board 200 and one side of the edge of the second printed circuit board 300 may be connected to each other via a first flexible printed circuit board (FPCB) 250, and the other side of the edge of the second printed circuit board 300 and the other side of the edge of the third printed circuit board 400 may be connected to each other via a second flexible printed circuit board (FPCB) 350

When a plurality of printed circuit boards is disposed above a first printed circuit board having an image sensor mounted thereon, as described above, the first printed circuit board is configured to be smaller than the plurality of printed circuit boards. Consequently, a support unit, in which the plurality of printed circuit boards is spaced apart from each other in the vertical direction, is disposed in a housing so as to receive the first printed circuit board. As a result, the plurality of printed circuit boards may be disposed above the first printed circuit board without direct connection with the first printed circuit board. Consequently, the printed circuit boards may not be physically stressed, whereby the printed circuit board having the image sensor mounted thereon is not deformed or dislocated, and therefore it is possible to acquire a captured image without distortion.

Although embodiments have been described with reference to a number of illustrative embodiments thereof, it should be understood that the embodiments are illustrative and not restrictive, and that numerous other modifications and applications may be devised by those skilled in the art that will fall within the intrinsic aspects of the embodiments. For example, various variations and modifications are possible in concrete constituent elements of the embodiments. In addition, it is to be understood that differences relevant to such variations and modifications fall within the spirit and scope of the present disclosure, which is defined in the appended claims.

MODE FOR INVENTION

Various embodiments have been described in the best mode for carrying out the invention.

INDUSTRIAL APPLICABILITY

A camera module, configured such that printed circuit boards are not physically stressed, whereby a printed circuit board having an image sensor mounted thereon is not deformed or dislocated, thus making it possible to acquire a captured image in a vivid state without distortion, may be used in various fields, such as those of vehicle cameras and mobile cameras.

The invention claimed is:

1. A camera module comprising:
a housing including an adhesion surface;
a lens barrel disposed in the housing;
a first printed circuit board disposed on the housing;
an adhesion member disposed between the adhesion surface and the first printed circuit board;
a second printed circuit board disposed on the first printed circuit board;
a first flexible printed circuit board connecting the first printed circuit board with the second printed circuit board; and
a fixing unit coupled to the housing through the second printed circuit board,
wherein the second printed circuit board is coupled to the housing by the fixing unit,
wherein the first printed circuit board comprises a first groove at a first corner of the first printed circuit board and a second groove at a second corner of the first printed circuit board, and
wherein the fixing unit comprises a first fixing unit disposed outside the first groove and a second fixing unit disposed outside the second groove.

2. The camera module according to claim 1,
wherein the first circuit board is physically spaced apart from the second printed circuit board, and
wherein a sectional area of the first printed circuit board is smaller than a sectional area of the second printed circuit board.

3. The camera module according to claim 1, wherein the first groove is disposed to surround a portion of the first fixing unit and the second groove is disposed to surround a portion of the second fixing unit.

4. The camera module according to claim 1, wherein the first fixing unit and the second fixing unit are disposed diagonally from each other, and
wherein the first fixing unit and the second fixing unit are disposed outside the adhesion surface.

5. The camera module according to claim 1, wherein the housing includes a first hole disposed at a first corner of the housing and a second hole disposed at a second corner of the housing opposite from the first corner of the housing,
wherein the adhesion surface comprises a first curved part adjacent to the first corner of the housing and a second curved part adjacent to the second corner of the housing, and
wherein a portion of the first curved part has a shape corresponding to the first groove, and a portion of the second curved part has a shape corresponding to the second groove.

6. The camera module according to claim 5, wherein the fixing unit is spaced apart from the first printed circuit board, and
wherein a portion of the first fixing unit is disposed in the first hole and a portion of the second fixing unit is disposed in the second hole.

7. The camera module according to claim 1, wherein a shape of the adhesion surface corresponds to a shape of an outer perimeter of a first surface of the first printed circuit board,
wherein the adhesion member contacts the adhesion surface and the outer perimeter of the first surface of the first printed circuit board, and
wherein an image sensor is disposed on the first surface of the first printed circuit board.

8. The camera module according to claim 7, wherein the first surface of the first circuit board faces the lens barrel and the adhesion surface, and
wherein the adhesion surface comprises a plurality of concave portions and a plurality of convex portions relative to the outer perimeter of the first surface of the first printed circuit board.

9. The camera module according to claim 8, wherein the first circuit board comprises a second surface facing the second circuit board, the second surface of the first circuit board being opposite from the first surface of the first circuit board, and
wherein the second surface of the first printed circuit board is spaced apart from the second printed circuit board in a direction parallel to an optical axis of the lens barrel.

10. A camera module comprising:
a housing comprising an adhesion surface;
a lens barrel disposed in the housing;
a first printed circuit board disposed on the housing;
an adhesion member disposed between the adhesion surface and the first printed circuit board;
a second printed circuit board disposed on the first printed circuit board; and
a first flexible printed circuit board connecting the first printed circuit board with the second printed circuit board; and
a fixing unit comprising a first fixing unit and a second fixing unit coupled to the housing through the second printed circuit board, wherein the first fixing unit and the second fixing unit are disposed diagonally from each other, and wherein the first fixing unit and the second fixing unit are disposed outside the adhesion surface and the first printed circuit board.

11. The camera module according to claim 10, wherein the fixing unit is spaced apart from the first printed circuit board.

12. The camera module according to claim 10, wherein the adhesion surface comprises a plurality of concave portions and a plurality of convex portions relative to an outer perimeter of a first surface of the first printed circuit board.

13. The camera module according to claim 10,
wherein a sectional area of the first printed circuit board is smaller than a sectional area of the second printed circuit board, and
wherein an image sensor is disposed on the first printed circuit board.

14. The camera module according to claim 10,
wherein the housing comprises a first hole disposed at a first corner of the housing and a second hole disposed at a second corner of the housing opposite from the first corner of the housing,
wherein the adhesion surface comprises a first curved part adjacent to the first corner of the housing and a second curved part adjacent to the second corner of the housing, and
wherein a portion of the first fixing unit is disposed in the first hole and a portion of the second fixing unit is disposed in the second hole.

15. The camera module according to claim 14, wherein the first circuit board comprises a first surface facing the adhesion surface and a second surface facing the second circuit board, the second surface of the first circuit board being opposite from the first surface of the first circuit board,
wherein the first printed circuit board has a first groove at a first corner thereof adjacent to the first corner of the housing and a second groove at a second corner thereof adjacent to the second corner of the housing, and
wherein a portion of the first groove has a shape corresponding to the first curved part of the adhesion surface of the housing, and a portion of the second groove has a shape corresponding to the second curved part of the adhesion surface of the second housing.

16. A camera module comprising:
a housing comprising an adhesion surface;
a lens barrel disposed in the housing;
a first printed circuit board disposed on the housing;
an adhesion member disposed between the adhesion surface and the first printed circuit board;
a second printed circuit board disposed on the first printed circuit board;
a first flexible printed circuit board connecting the first printed circuit board with the second printed circuit board; and
a fixing unit that penetrates the second printed circuit board and is coupled to the housing,
wherein at least two corners of the adhesion surface are recessed inwardly, and
wherein the adhesion surface comprises a plurality of concave portions and a plurality of convex portions.

17. The camera module according to claim 16, wherein the first printed circuit board comprises a first groove at a first corner of the first printed circuit board and a second groove at a second corner of the first printed circuit board, and
wherein the fixing unit comprises a first fixing unit disposed in an area corresponding to the first groove and a second fixing unit disposed in an area corresponding to the second groove.

18. The camera module according to claim 16, wherein the first circuit board is spaced apart from the second printed circuit board, and
wherein a sectional area of the first printed circuit board is smaller than a sectional area of the second printed circuit board, and
wherein an image sensor is disposed on the first printed circuit board.

19. The camera module according to claim 17, wherein the first fixing unit and the second fixing unit are disposed diagonally from each other, and
wherein the first fixing unit and the second fixing unit are disposed outside the adhesion surface and the first printed circuit board.

20. The camera module according to claim 17, wherein the housing comprises a first hole disposed at a first corner of the housing and a second hole disposed at a second corner of the housing opposite from the first corner of the housing,
wherein the adhesion surface comprises a first curved part adjacent to the first corner of the housing and a second curved part adjacent to the second corner of the housing, and
wherein a portion of the first curved part has a shape corresponding to the first groove and a portion of the second curved part has a shape corresponding to the second groove.

* * * * *